(12) United States Patent
Hilbert et al.

(10) Patent No.: US 11,341,642 B2
(45) Date of Patent: May 24, 2022

(54) METHOD AND SYSTEM FOR MAPPING A FRACTION OF TISSUE CONCENTRATIONS IN MRI

(71) Applicants: SIEMENS HEALTHCARE GMBH, Erlangen (DE); CENTRE HOSPITALIER UNIVERSITAIRE VAUDOIS, Lausanne (CH)

(72) Inventors: Tom Hilbert, Lausanne (CH); Tobias Kober, Lausanne (CH); Giulia Maria Chiara Rossi, Lausanne (CH); Josefina Adriana Maria Bastiaansen, Lausanne (CH)

(73) Assignees: Siemens Healthcare GmbH, Erlangen (DE); Centre Hospitalier Universitaire Vaudois, Lausanne (CH)

( * ) Notice: Subject to any disclaimer, the term of this patent is extended or adjusted under 35 U.S.C. 154(b) by 0 days.

(21) Appl. No.: 17/154,318

(22) Filed: Jan. 21, 2021

(65) Prior Publication Data
US 2021/0224982 A1 Jul. 22, 2021

(30) Foreign Application Priority Data
Jan. 21, 2020 (EP) .................................... 20152927

(51) Int. Cl.
*G06T 7/00* (2017.01)
*G01R 33/48* (2006.01)
(Continued)

(52) U.S. Cl.
CPC ........ *G06T 7/0012* (2013.01); *G01R 33/4828* (2013.01); *G01R 33/50* (2013.01);
(Continued)

(58) Field of Classification Search
USPC .......................................................... 324/309
See application file for complete search history.

(56) References Cited

U.S. PATENT DOCUMENTS

2016/0025833 A1* 1/2016 Polimeni ............ G01R 33/5608
324/309
2017/0322274 A1* 11/2017 Bolster, Jr. ......... G01R 33/4804
(Continued)

OTHER PUBLICATIONS

McGivney, Debra et al: "Bayesian estimation of multicomponent relaxation parameters in magnetic resonance fingerprinting"; Magnetic Resonance in Medicine, vol. 80, No. 1, Nov. 20, 2017, pp. 159-170, XP055636572, US, ISSN: 0740-3194, DOI: 10.1002/mrm.27017;2017.
(Continued)

*Primary Examiner* — Rodney E Fuller
(74) *Attorney, Agent, or Firm* — Laurence A. Greenberg; Werner H. Stemer; Ralph E. Locher

(57) ABSTRACT

A tissue type fraction within a biological object is determined by a phase-cycled acquisition of several images of the object and deriving a complex signal profile for each voxel of the acquired images; generating a multidimensional dictionary of simulated signal profiles, wherein each simulated signal profile is configured for simulating the previously derived complex signal profile; using a weight optimization algorithm configured for expressing the complex signal profile as a weighted sum of the simulated signal profiles, wherein the weight optimization algorithm provides as output for each voxel a matrix M of optimized weights; for each voxel and each dimension of the obtained matrix M, extracting from the matrix M a distribution of the obtained optimized weights; and determining a type of tissue composing each voxel from the obtained distributions.

13 Claims, 3 Drawing Sheets

(51) Int. Cl.
*G01R 33/50* (2006.01)
*G01R 33/56* (2006.01)

(52) U.S. Cl.
CPC .................... *G01R 33/5608* (2013.01); *G06T 2207/10088* (2013.01); *G06T 2207/30004* (2013.01)

(56) References Cited

U.S. PATENT DOCUMENTS

2018/0292492 A1    10/2018  Griswold et al.
2018/0321347 A1*   11/2018  Wang .................... A61B 5/055

OTHER PUBLICATIONS

Dan Ma et al: "Magnetic resonance fingerprinting"; Nature, vol. 495, No. 7440, pp. 187-192, XP055183037, ISSN: 0028-0836, DOI: 10.1038/nature11971;2013.

\* cited by examiner

METHOD AND SYSTEM FOR MAPPING A FRACTION OF TISSUE CONCENTRATIONS IN MRI

CROSS-REFERENCE TO RELATED APPLICATION

This application claims the priority, under 35 U.S.C. § 119, of European patent application EP20152927, filed Jan. 21, 2020; the prior application is herewith incorporated by reference in its entirety.

BACKGROUND OF THE INVENTION

Field of the Invention

The present disclosure is directed, in general, to imaging techniques for imaging biological objects, such as tissues, and more specifically to tissue fractions in magnetic resonance imaging (MRI). More specifically, the present invention is directed to methods and systems for water-fat separation and voxel-wise fat fraction quantification using MRI.

For many MR imaging applications, a reliable distinction between water and fat signals is crucial to achieve sufficient contrast and to reduce artefacts due to the interference of fat and water. Since fat has a much shorter T1 relaxation time relative to water, the voxel signal from fat might be significantly larger than the water signal, especially for short TR experiments. This might lead to a significant shielding of the water signal relative to fat. Also, due to the different chemical environment, protons in water (H2O) and protons in fat (CH2 and CH3) experience different local magnetic fields (the "chemical shift", a common phenomenon in MRI). This results in a chemical shift difference of about 3.5 ppm, leading to a frequency shift of about 440 Hz at 3 T. In the rotating coordinate frame for water, this might cause spatial misregistrations of spins belonging to fatty tissue in the frequency encoding dimension. Many fat suppression and water-fat separation strategies have been developed to cancel out or mitigate this effect.

Non-spoiled steady-state gradient echo (GRE) acquisitions (also referred to as steady state free precession (SSFP) or balanced steady state free precession (bSSFP) if the gradients are balanced) allow to obtain almost optimal signal-to-noise ratio in short scan times. However, common fat suppression strategies proved to be poorly compatible with those acquisitions. One of the major limitations is their cost in terms of acquisition time, which compromises the time efficiency of GRE acquisitions. In fact, techniques such as STIR [1] (Short-TI Inversion Recovery) and Dixon [2] (fat separation using in-phase/out of phase images) require long repetition times in order to give time to the magnetization to return to the thermal equilibrium magnetization (M0) between successive pulses or due to the constraints on echo time to achieve the dephasing required for signal separation, respectively. Similarly, the spoiler gradient which must be used for fat saturation pulses makes the technique less efficient for fat suppression in GRE acquisitions. In fact, the transition towards the steady-state magnetization needs to be restarted after each fat saturation pulse, thus affecting the steady-state signal. Classic water selective pulses allow a more time efficient data collection, but still result in increased TR due to the prolonged RF pulse duration, which may lead to an increase in banding artefacts.

Therefore, a strategy allowing to suppress fat and/or separate water and fat signals from non-spoiled steady-state GRE acquisitions without affecting the steady-state signals nor prolonging the TR is needed.

In addition, a method allowing to obtain voxel-wise estimates of fat fractions might add value to a multitude of clinical applications. For example, the diagnosis of certain liver pathologies would benefit from a non-invasive imaging technique for the quantitative assessment of liver fat [3]. This is the case for hepatic steatosis, which is characterized by abnormal and excessive accumulation of lipids within hepatocytes. The clinical gold standard for assessment of liver fat is liver biopsy, which is a highly invasive procedure that is prone to sampling errors. A non-invasive MRI technique to measure the proton density fat-fraction may improve patient comfort and would probably be the preferred choice compared to an invasive liver biopsy or to less accurate ultrasounds (US) and computed tomography (CT) imaging methodologies.

Also, fat quantification in bone marrow (BM) is increasingly being used as a tool for evaluating the relationship between osteoporosis and bone marrow adiposity as well as for characterizing cellularity for radiation dosimetry in cancer patients [4]. The fat quantification in localized regions has been traditionally achieved by means of single-voxel MR spectroscopy (MRS). Recent studies [4] suggest that chemical shift-based water-fat imaging might be a valid alternative leading to comparable results. Finally, recent studies suggest that myocardial fat fraction quantification via MRI would provide additional prognostic information for cardiovascular diseases [5]. In fact, fatty infiltration in myocardium has been shown to be associated with heart failure [6]. This might have great importance for patients with heart failure but preserved left ventricular ejection fraction [7], which represent about 50% of heart failure cases [8] [9]). Similar to the liver, biopsy is the most commonly used method for measuring the fat fraction in the heart. However, the extreme invasive nature of the procedure limits the usage of the technique for prognostic purposes. Thus, a non-invasive MRI technique would be a preferable option. On top of that, the standard procedure for patients with heart failure already foresees an MRI exam for structural and functional characterization. Thus, the addition of a sequence measuring the myocardial fat fraction might provide additional prognostic information within a routine exam.

An efficient non-invasive technique based on MRI would thus be the ideal solution. Due to the efficiency of steady-state non-spoiled GRE imaging and achievable tissue contrast, considerable effort has been put in finding a compatible and reliable fat-suppression strategy. Methods such as linear combination SSFP [10] and fluctuating equilibrium MRI [11] have been proposed, without however succeeding in maintaining a TR comparable to the one of standard acquisitions. Magnetization-prepared SSFP methods [12] [13] relying on frequency selective fat pre-saturation pulses have been designed, but often result in transient imaging artefacts. Promising results have been achieved by methods based on phase detection [14]: by choosing an appropriate TR, lipid and water peaks can be cantered in adjacent signals bands with opposite phase and can thus be separated [15]. However, the efficacy of the approach is limited by partial volume effects. When water and fat spins occupy a single voxel, their signals might interfere destructively resulting in undesired so-called water-fat cancellation artefacts.

Recent research has been focused at finding strategies to exploit multicompartment effects on the measured signal in order to quantify fat fraction [16] [17]. In the context of magnetic resonance fingerprinting (MRF) with unbalanced SSFP sequences, Cencini et al. [17] proposed a novel dictionary-based multicomponent approach for water-fat separation. The method is based on a dictionary of simulated signals which is a combination of a 3D water-only dictionary (T1 water, off-resonance, B1+) and a 3D fat-only dictionary (T1 water, off-resonance, B1+) shifted by 3.5 ppm. Dictionary entries are linear combinations of those two dictionaries with varying water and fat fractions, giving rise to a 5D dictionary (T1 water, T1 fat, off-resonance, B1+, fat fraction). The acquired MRF signals are then voxel-wise matched to the dictionary. While, in general, this approach has been shown to provide reliable fat fraction estimations, problems of blurring still compromise the parameter estimations at the boundaries. Also, the size of the dictionary limits the resolution of the technique.

BRIEF SUMMARY OF THE INVENTION

It is accordingly an object of the invention to provide an efficient fat-water separation and voxel-wise fat fraction quantification MRI method and corresponding system that overcome the above-mentioned disadvantages of the heretofore-known devices and methods of this general type.

With the above and other objects in view there is provided, in accordance with the invention, a method for determining by magnetic resonance imaging (MRI) one or several tissue types within a voxel in an object, the method comprising:

performing a phase-cycled acquisition consisting of acquiring for the object a plurality of images with different radiofrequency phase increments and deriving a complex signal profile for each voxel of the images thus acquired;

generating a multidimensional dictionary of simulated signal profiles, with each simulated signal profile being configured for simulating a previously derived complex signal profile;

using a weight optimization algorithm configured for expressing the complex signal profile as a weighted sum of the simulated signal profiles, the weight optimization algorithm receiving as input the complex signal profile for each voxel and the simulated signal profiles of the dictionary, and outputting for each voxel a matrix M of optimized weights;

for each voxel and each dimension of the matrix M, extracting from the matrix M a distribution of the optimized weights; and determining from the distributions thus obtained the one or several tissue types composing each voxel.

In other words, the objects of the invention are achieved by a method and a system for tissue type fraction (e.g. water and fat) mapping in MRI, as described and claimed.

The present invention proposes a method for tissue separation and tissue fraction estimation based on a phase-cycled steady-state non-spoiled GRE acquisition (e.g. bSSFP) combined with a dictionary-based reconstruction. By tissue, we mean the chemical species composing a biological object. The dictionary-based reconstruction involves a dictionary, for instance a two-dimensional (2D) dictionary as presented hereafter, wherein said dictionary contains, with respect to a biological object to be imaged, MRI simulated signal evolutions resulting from all combinations of the biological object tissue types and MRI apparatus imaging parameters that are going to be used for imaging said biological object.

In particular, the method according to the invention comprises the following successive steps:

performing a phase-cycled acquisition consisting of acquiring several steady-state GRE images with different radiofrequency (RF) phase increments and deriving from the reconstructed images (i.e. the reconstructed phase and magnitude images from GRE acquisitions) a complex signal profile for each voxel of the acquired images (for each voxel, the complex signal profile is the steady-state transverse magnetization for each RF pulse phase increment, in other words, it is the complex value of the given voxel across the different GRE acquisitions);

building or generating a dictionary of simulated signal profiles, preferably a 2D dictionary, with TR, TE and RF excitation angle matching the imaging parameters used for the phase-cycled acquisition and preferably M0 fixed to 1, wherein each simulated signal profile is configured for simulating the previously measured complex signal profile. The dictionary is typically characterized by several dimensions, it is for instance a 2D or 3D dictionary, wherein each dimension is associated with a variable parameter whose values vary within a predefined range of values, so that each simulated signal profile is obtained for a different value of said parameter. In case of a 2D dictionary, the two dimensions, and thus variable parameters, are preferentially the relaxation time ratio T1/T2 (which is specific to each type of tissue, its value enabling therefore to determine a corresponding type of tissue) and the off-resonance frequency. The 2D dictionary might be represented by a matrix D, wherein each element di,j of the matrix corresponds to a simulated signal profile obtained for a value vi of the relaxation time ratio and a value wj of the off-resonance frequency. In other words, within a same line and for each line of the matrix, the value vi remains the same for each simulated signal profile, while the values wj of the off-resonance frequency change, so that different lines of the matrix show simulated signal profile obtained for different values vi, while each column of the matrix shows simulated signal profiles obtained with the same value wj. The simulated signal profiles are computed by the system according to the invention while using as input the imaging parameters that are for instance currently used for imaging the biological object, and making the variable parameters vary within their respective predefined range of values;

using a weight optimization algorithm configured for expressing the complex signal profile acquired for each voxel as a weighted sum of the simulated signal profiles, preferentially of all simulated signal profiles, stored in the dictionary, wherein weights are optimized in order to minimize the distance between the complex signal and the weighted sum of the simulated signals (i.e. the difference between complex signal values and the weighted sum of simulated signal values), wherein the weight optimization algorithm receives as input the complex signal profile for each voxel and the simulated signal profiles of the dictionary, e.g. of the 2D dictionary, and provides as output for each voxel a matrix M of optimized weights (e.g. of optimized weights mi,j, i.e. the elements mi,j of the matrix are said obtained optimized weights), said matrix having the same dimension as the dictionary, e.g. a 2D matrix, wherein each cell (element) in the matrix of optimized weights comprises a value that represents a contribution of a corresponding entry in the dictionary (i.e. for the 2D case, a contribution of the simulated signal profile corresponding to the element di,j of the matrix D; the weight mi,j in the matrix M indicates how much the simulated signal profile di,j (which has been simulated for one specific value vi for $T_1/T_2$, one specific off-resonance frequency value wj and all the other parameters matching the imaging parameters) in the dictionary contributes to the acquired signal profile) to the complex signal profile. Of course, more parameters and/or dimensions of the dictionary could be used to model the acquired complex signals, while keeping the present idea to model the contribution of the different components (i.e. the different simulated signal patterns stored within the dictionary) to the measured phase-cycled MR signal. According to the present invention, the matrix of optimized weights comprises information on the voxel content in terms of relaxation time ratios and off-resonance frequencies. In the next step, said information is extracted from the matrix of optimized weights;

for each voxel and each dimension of the obtained matrix of optimized weights, extracting from the latter a distribution (spectrum) of the obtained optimized weights (e.g. a distribution of the obtained optimized weights with respect to the time ratios and off-resonance frequencies in case of said 2D matrix), wherein, for each dimension of the matrix, the distribution is computed by projecting the matrix of optimized weights onto an axis representing values of the variable parameter associated to said dimension (e.g. values of the relaxation time ratios for one dimension and values of the off-resonance frequencies for the other dimension in said case of a 2D matrix). By projecting, it has to be understood that for each value of the variable parameter that was chosen when building the dictionary, the optimized weights are added to each other, making it possible to construct said distribution of the weights that shows, in function of the values of said variable parameter, the sum of the weights obtained for said value;

determining a fraction of tissue type composing each voxel from the obtained distribution. The present invention indeed enables to extract information about tissue types composing a given voxel from the obtained distributions, providing therefore a mapping of the tissue types and fraction in images of the object. In particular, the system according to the invention is configured for (e.g. automatically) computing the fraction of a given tissue type within a voxel as the ratio between the sum of the weights inside a range of said variable parameters and the sum of the weights in the entire simulated range of said variable parameters. For instance, the fat fraction ($f_F$) and water fractions ($f_W$) are defined as:

$$f_F = F/(F+W) \quad \text{(Eq. 1)}$$

$$\text{and } f_W = 1 - f_F \quad \text{(Eq. 2)}$$

where F and W are the integrals of the spectra over the relevant ranges of variable parameters for fat and for water tissue types, respectively. In addition, since the matrix of optimized weights provides an estimation of the contribution of each signal profile in the dictionary to the acquired complex signal profile, the thermal equilibrium magnetization M0 for a considered voxel can be estimated with a weighted sum of the M0 of each dictionary entry (i.e. of each element dij of the matrix representing the dictionary). For instance, if the simulated signal profiles have been obtained with M0=1, then the system according to the invention can estimate M0 for a given voxel can by summing all weights in the optimized weight matrix.

Preferably, the present invention proposes to create parametric maps of $f_F$, $f_W$ and M0 by applying the above described method over the entire volume of the biological object. In particular, M0-weighted water-fat separated images are obtained by the system by multiplying the fraction maps by the M0 map.

With the above and other objects in view there is also provided, in accordance with the invention, a system, such as an MRI apparatus, that is configured for mapping a fat fraction in an image of a biological object by carrying out the steps of the above-described method. The novel system comprises, by way of example:

optionally, an imaging system, such as the imaging system of an MRI apparatus, configured for acquiring said complex signal profile from the biological object;

optionally, a memory for storing each of the acquired complex signal profiles;

a control unit comprising a processor, the control unit being configured for collecting the complex signal profiles acquired by the imaging system and for processing the latter; and optionally a display for displaying an image resulting from the processing of the complex signal profiles;

where the control unit is configured for automatically carrying out the above-summarized method.

The foregoing is a broadly generalized outline of the features and technical advantages of the present disclosure so that those skilled in the art may better understand the detailed description that follows. In particular, the present invention enables to determine fat and water fractions in each voxel of an image of a biological object. The concept of the invention may not only apply to the determination of fat and water fractions, but may apply to the determination of the fractions of other types of tissue.

Additional features and advantages of the disclosure will be described hereinafter that form the object of the claims. Those skilled in the art will appreciate that they may readily use the concept and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Other features which are considered as characteristic for the invention are set forth in the appended claims.

Although the invention is illustrated and described herein as embodied in method and system for mapping a fraction of tissue concentrations in magnetic resonance imaging, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
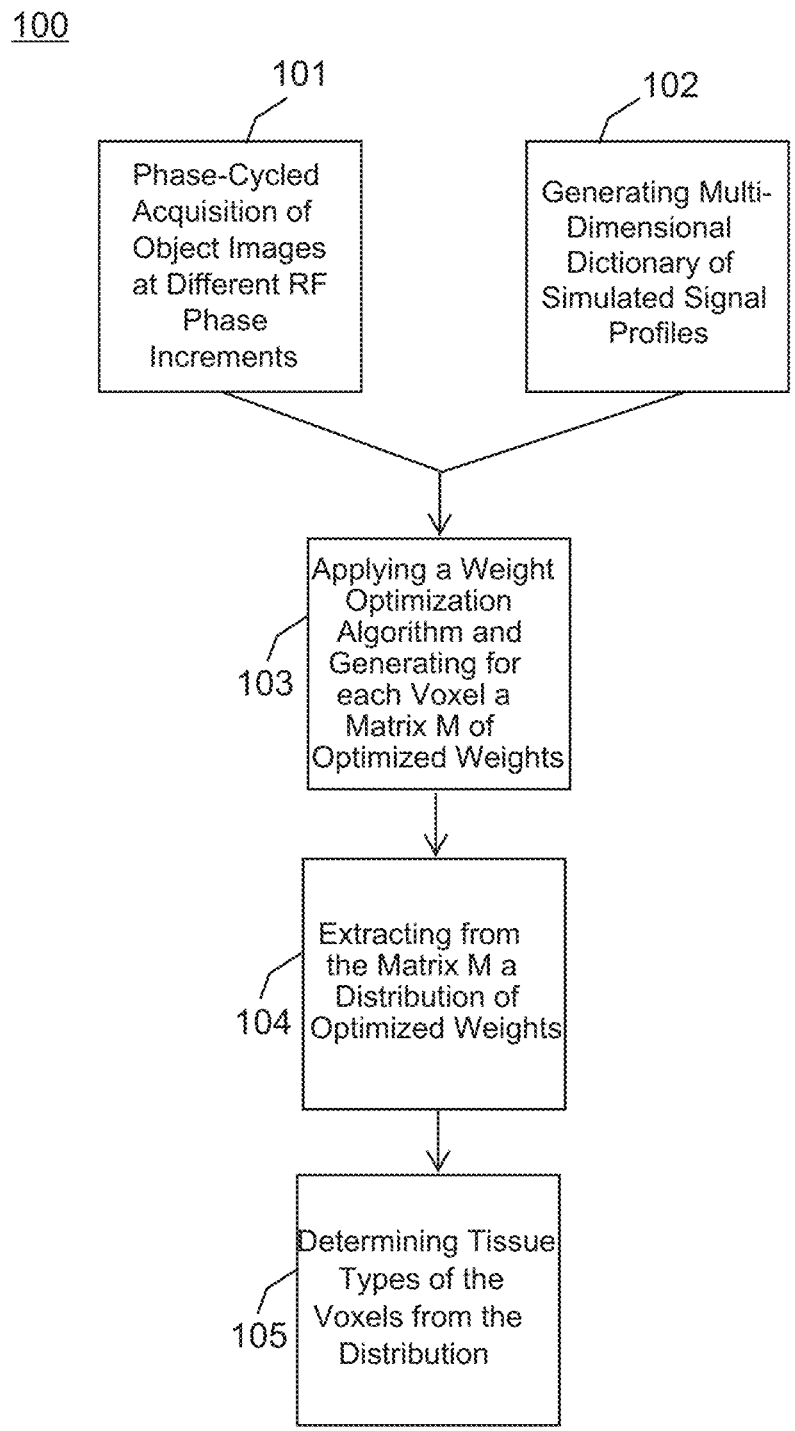
FIG. 1 illustrates a flowchart of a method for automatically mapping a fat and water fraction within a biological object according to the invention.
Figure 2:
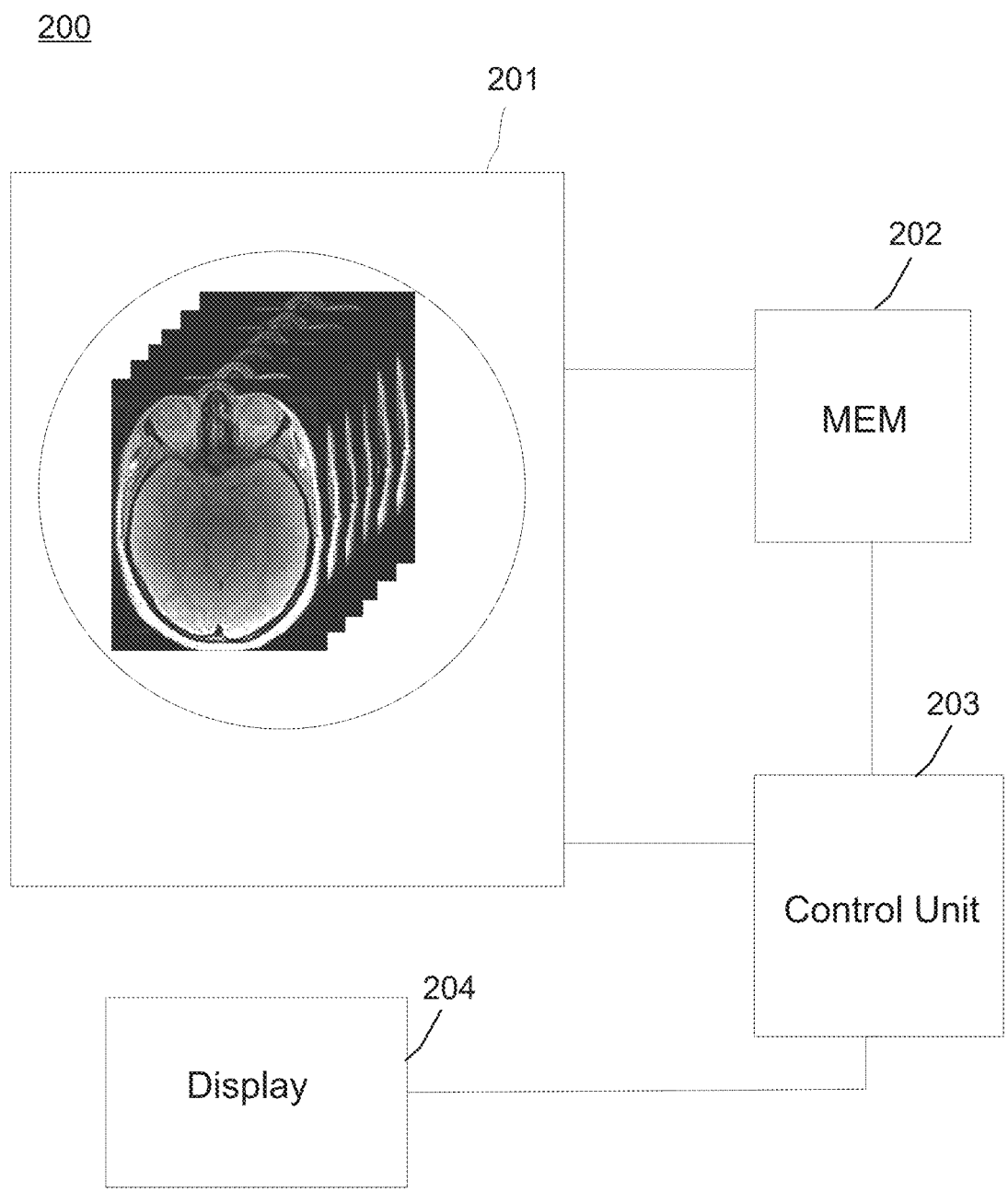
FIG. 2 illustrates a system for implementing the claimed method.
Figure 3:
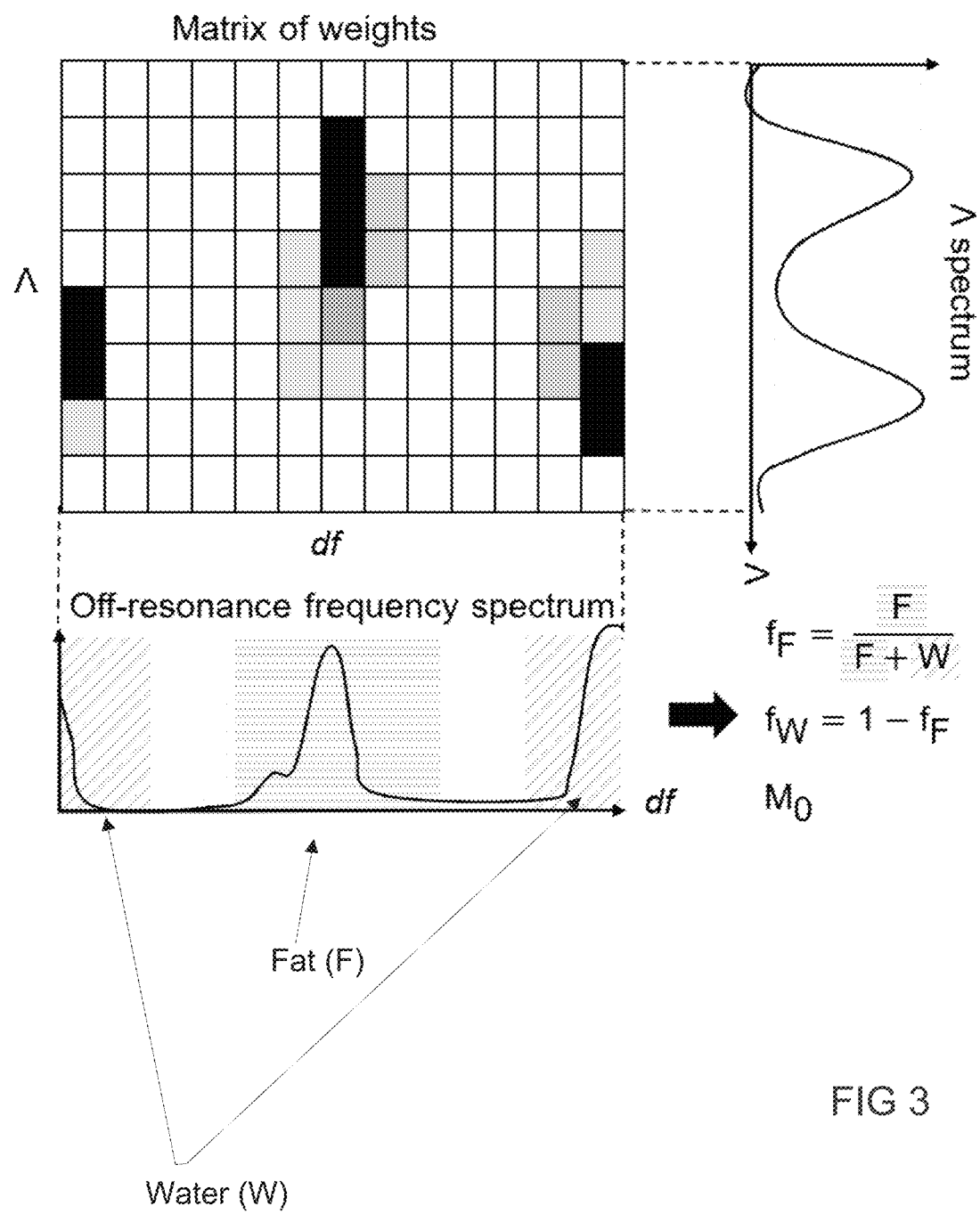
FIG. 3 illustrates an example of optimized weight matrix and the resulting off-resonance frequency and relaxation time ratio spectra.

FIGS. 1 to 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Referring now to the figures of the drawing in detail and first, in particular, to FIG. 1 thereof, there is shown an illustration of the method 100 according to the invention, as carried out by the system according to the invention for automatically generating fat-water separated images.

At step 101, a phase-cycled acquisition is performed or controlled by the system according to the invention in order to acquire for each voxel within a biological object a complex signal profile. Preferentially, a phase-cycled bSSFP acquisition is used in order to obtain a bSSFP complex signal profile for each voxel. The acquisition routine consists preferentially of multiple scans with a conventional bSSFP sequence, where the RF pulse phase $\varphi_j$ is changed at each scan. For instance, for a N phase-cycled acquisition, the RF phases are equidistantly distributed as follows:

$$\varphi_j = \frac{2\pi}{N-1}(j-1), j = 1, 2, \ldots, N \quad \text{(Eq. 3)}$$

For each voxel, the bSSFP complex signal profile can be obtained by considering the evolution of the steady-state transverse magnetization of the given voxel across the N phase-cycled complex images.

At step 102, and preferably at the same time (i.e. step 101 and step 102 take place simultaneously), a dictionary of simulated signal profiles is generated by the system according to the invention. For instance, a dictionary of simulated bSSFP signal profiles is created through Bloch simulations (physical MR signal model). For this purpose, and first, sets of parameters are defined for each dictionary entry. While TR, TE and the RF excitation angle α are fixed to match the MRI sequence imaging parameters, relaxation time ratios Λ and off-resonance frequencies are the variable parameters that can vary across dictionary entries. Preferentially, relaxation time ratio values Λ are chosen to cover ranges of values that are relevant for water and fat (e.g. from 1 to 25) and off-resonance frequency values df are chosen to cover all the frequency range from 0 to 1/TR. Then each dictionary entry (i.e. each element of the dictionary when the latter is represented as a matrix D with elements di,j) is built by simulating a phase-cycled acquisition for a given set of parameters comprising the imaging parameters and said variable parameters. To do so, steady-state complex signals are simulated for each of the N different RF pulse phases. Then, the dictionary entry is obtained by concatenating the complex steady-state transverse magnetizations for the different RF pulse phases in order to obtain said simulated signal profile for the considered entry.

At step 103, the control unit of the system according to the invention uses a weight optimization algorithm for expressing the complex signal profile acquired for each voxel as a weighted sum of all simulated signal profiles stored in the dictionary, wherein weights are optimized in order to minimize the distance between the complex signal and the weighted sum of the simulated signals. The weight optimization algorithm is therefore a dictionary-based fitting algorithm. The latter is for instance used in order to express the acquired bSSFP complex signal profile as a weighted sum of all the bSSFP signal profiles that have been simulated and stored in the dictionary. Weights are optimized in order to minimize the distance between the acquired signal profile and the weighted sum of the dictionary signal profiles by using for instance the following mathematical expression, wherein ("argmin(p(w))")_r "w" is function that returns the value w of the input array for which the specified function p(w) attains its minimum value and $\|\cdot\|\_2$ represents the Euclidean norm:

$$\hat{w} = \underset{w}{\operatorname{argmin}} \|D \cdot w - s_{acq}\|_2^2 + \lambda \|w\|_2^2 \text{ subject to } w \geq 0 \quad \text{(Eq. 4)}$$

where $\hat{w}$ is an optimized weight matrix, sacq is the acquired complex signal profile (e.g. concatenation of real and imaginary parts), D is the dictionary of simulated signal profiles (e.g. concatenation of real and imaginary parts) and W are the weights associated to the dictionary entries. The squared norm (L2 norm) is chosen as a distance metric and the constraint $\hat{w} \geq 0$ is added to avoid the occurrence of negative weights that would hinder finding a biologically relevant solution. Optionally, the Tikhonov regularization term $\lambda \|w\|_2^2$ might be added in order to give preference to solutions with smaller weights.

An example of implementation of the weight optimization algorithm consists in using a three-step algorithm.

First, a single compartment fitting is performed in order to determine the one dictionary entry with the smallest distance to the acquired data. The distance is defined as the L2-norm of the difference between the two signals, i.e. the acquired signal and the signal obtained by fitting. In dictionary fitting, a compartment refers to a dictionary entry. The single compartment fitting is configured for determining which single entry in the dictionary fits best the acquired signal. In contrasts, and optionally, the use of a multi-compartment fitting for the present invention would determine which combination of several dictionary entries fits best the acquired signal.

Second, a phase correction step is used to correct potential hardware-related phase offsets in the acquired signal profiles. To do so, a median distance between the phase profile (i.e. the phase of the signal as a function of the phase cycle) of the acquired signal profile and the phase profile of the best fit signal (i.e. the simulated signal profile which best fits the acquired signal profile) is computed. The obtained value represents a phase shift between the dictionary entry (i.e. the simulated signal profile) and the acquired signal profile and can be used to correct the phase of the acquired signal profile.

Finally, the corrected acquired signal profile is fitted a second time to the dictionary (repeating therefore step 103 with the phase corrected acquired signal) in order to obtain a final array of optimized weights, notably according to Eq. 4.

At step 104, a spectrum is extracted for each voxel and for each dimension of the dictionary from the obtained matrix of optimized weights. For instance, in the case of the present illustration based on a 2D dictionary, spectra of the voxel composition in terms of relaxation time ratios and off-resonance frequency are automatically generated by the control unit from the obtained optimized weights. An illustration of such spectra is provided in FIG. 3.

At step 105, the system determines one or several types of tissue composing a voxel (i.e. it determines at least one tissue type composing the voxel), and then, optionally a fraction of the type(s) of tissue composing the voxel by extracting information about tissue type(s) composing the voxel from the obtained spectra. In particular, the control unit according to the invention is configured for estimating the fraction of tissue types (or more precisely of chemical species) that compose the voxel like the fraction of Fat $f_F$, the fraction of Water $f_W$, as well as other tissue type property, like its thermal equilibrium magnetization M0, from said the obtained spectra.

For this purpose and preferentially, the present invention proposes to obtain an estimation of the fat fraction by defining a range of frequencies for fat and respectively water based on the expected spectral resolution for fat and respectively water in MRI experiments. Practically, the control unit according to the invention is configured for estimating the fat fraction by calculating the integral of the off-resonance frequency spectrum over this range of frequencies defined for fat divided by the integral of the off-resonance frequency spectrum over both ranges defined for fat and water. By assuming that only fat and water contribute to the measured signal, the water fraction is then computed by the control unit as being one minus the estimated fat fraction (see FIG. 3). Additionally, or optionally, the control unit is further configured for estimating M0 as being equal to the sum of all the weights.

According to the previously detailed embodiment, a phase-cycled bSSFP acquisition has been performed for acquiring complex signal profiles. Of course, the skilled person will recognize that said phase-cycled bSSFP acquisitions might be replaced by any steady-state non-spoiled GRE acquisition, as for example a phase-cycled FISS.

The simulated signal profiles in the dictionary can be obtained by mean of any suitable numerical simulations, like Bloch simulations. Alternatively, an analytical description of the signal [18] or Extended Phase Graph (EPG) modelling can be used. Modelling of additional effects (e.g. MT, chemical exchange, B1) could be included in the simulations. If additional variable parameters were to be considered, the dimensionality of the dictionary could be increased as needed while applying the present concept.

For the fitting, alternative weight optimization algorithms compatible with the dimensionality of the problem can be used (e.g. non-negative least squares (NNLS), quadratic programming, NNLS with joint sparsity constraint). Using different distance metrics and different/additional regularization terms (e.g. Laplacian regularization) is also easily conceivable by the skilled person.

In particular, alternative solutions can be implemented in order to estimate biological object tissue properties starting from the obtained voxel-wise spectra. For example, the same procedure could be used to extract information from the relaxation time ratio spectra or by considering both dimensions at the same time. Also, instead of using pre-defined ranges of parameters, a watershed algorithm could be used in order to detect the peaks of water and fat.

Finally, FIG. 2 schematically illustrates an embodiment of a system 200 according to the invention. Said system 200 is notably configured for automatically mapping a fraction of a type of biological tissue present within a biological object, e.g. by mapping the fraction of fat within a biological tissue. The system is typically a computer-implemented system. The system 200 comprises:

optionally, an MRI imaging system 201, for acquiring MRI signal data in order to determine for each voxel of the biological object a complex signal profile. The MRI imaging system preferentially uses a phase-cycled bSSFP acquisition for determining/acquiring said complex signal profile;

optionally, a memory 202, connected to the MRI imaging system 201, for storing each acquired MRI complex signal profile;

a control unit 203 connected to the memory 202 and to the MRI imaging system 201. The control unit 203 comprises notably a processor configured for processing the acquired complex signal profiles;

optionally, a display 204 for displaying said mapping;

the system 200 being configured for carrying out the steps of the previously described method.

To summarize, the present invention proposes a system and method enabling a determination of the fraction of a type of biological tissue comprised within a biological object and allowing a mapping of the fraction of tissue concentration in MRI images of said object, wherein tissue type separated images, e.g. fat-water separated images, are generated based on the extraction of multicomponent information from a phase-cycled signal profile by fitting of a multidimensional dictionary. Compared to existing techniques, the present invention has notably the following advantages:

the claimed technique is compatible with non-spoiled steady-state GRE acquisitions (bSSFP and others), thus allowing to obtain water-fat separated images from very SNR/time efficient acquisitions. Also, voxel-wise fat-fraction estimations can be obtained, thus representing a valid alternative to biopsy. This is of high interest for clinical applications;

the water-fat separated images are generated by dictionary fitting of a signal profile and not from a single acquisition. This means that the obtained images are free of banding artefacts arising from signal nulls at specific frequencies, an effect which is typical for non-spoiled GRE acquisitions. Also, the dictionary fitting algorithm tolerates relatively high amounts of noise without impacting the accuracy of the estimations, thus dampening the effects of noise on the individual acquisitions;

the estimation of the parameters, i.e. the tissue properties, like the fat/water fraction, is based on approximating the signal profile as a weighted sum of multiple dictionary entries rather than on the best approximation of the acquired signal profile by mean of a single dictionary entry. First, this allows for minimizing the dimensionality of the dictionary: a two-dimensional dictionary ($T_1/T_2$, off-resonance frequency) can be used instead of a four-dimensional one ($T_1/T_2$ water, $T_1/T_2$ fat, off-resonance frequency, fat fraction), speeding up the processing and greatly reducing the memory footprint of the algorithm. From a technical point of view, this also allows to rely on simple signal models, where signal profiles are simulated for a single combination of resonance frequency and relaxation time ratio, without need of a priori knowledge of the spectral components of water and fat nor having to model the multi-peak nature of the fat spectrum;

finally, the present invention proposes a more realistic representation of an in vivo situation resulting in distributions of values ($T_1/T_2$, off-resonance frequencies) rather than in specific values.

The following is a summary list of the literature references mentioned in the above description:

[1] G. B. a. I. Young, "MR Imaging: Clinical Use of the Inversion Recovery Sequence," *Journal of Computer Assisted Tomography,* 1985.

[2] T. W. Dixon, "Simple Proton Spectroscopy Imaging," 1984.

[3] O. Bieri and K. Scheffler, "Fundamentals of balanced steady state free precession MRI," *Journal of Magnetic Resonance Imaging*, vol. 38, pp. 2-11, 2013.

[4] D. C. Karampinos, G. Melkus, T. Baum, J. S. Bauer, E. J. Rummeny and R. Krug, "Bone marrow fat quantification in the presence of trabecular bone: initial comparison between water-fat imaging and single-voxel MRS," *Magnetic resonance in medicine*, vol. 71, pp. 1158-1165, 2014.

[5] P. Kellman, D. Hernando and A. E. Arai, "Myocardial fat imaging," *Current cardiovascular imaging reports*, vol. 3, pp. 83-91, 2010.

[6] A. P. Burke, A. Farb, G. Tashko and R. Virmani, "Arrhythmogenic right ventricular cardiomyopathy and fatty replacement of the right ventricular myocardium: are they different diseases?," *Circulation*, vol. 97, pp. 1571-1580, 1998.

[7] C.-K. Wu, H.-Y. Tsai, M.-Y. M. Su, Y.-F. Wu, J.-J. Hwang, J.-L. Lin, L.-Y. Lin and J.-J. Chen, "Evolutional change in epicardial fat and its correlation with myocardial diffuse fibrosis in heart failure patients," *Journal of clinical lipidology*, vol. 11, pp. 1421-1431, 2017.

[8] C. W. Yancy, M. Lopatin, L. W. Stevenson, T. De Marco, G. C. Fonarow, A. D. H. E. R. E. S. A. Committee, Investigators and others, "Clinical presentation, management, and in-hospital outcomes of patients admitted with acute decompensated heart failure with preserved systolic function: a report from the Acute Decompensated Heart Failure National Registry (ADHERE) Database," *Journal of the American College of Cardiology*, vol. 47, pp. 76-84, 2006.

[9] T. E. Owan, D. O. Hodge, R. M. Herges, S. J. Jacobsen, V. L. Roger and M. M. Redfield, "Trends in prevalence and outcome of heart failure with preserved ejection fraction," *New England Journal of Medicine*, vol. 355, pp. 251-259, 2006.

[10] S. S. Vasanawala, J. M. Pauly and D. G. Nishimura, "Linear combination steady-state free precession MRI," *Magnetic Resonance in Medicine: An Official Journal of the International Society for Magnetic Resonance in Medicine*, vol. 43, pp. 82-90, 2000.

[11] S. S. Vasanawala, J. M. Pauly and D. G. Nishimura, "Fluctuating equilibrium MRI," *Magnetic Resonance in Medicine: An Official Journal of the International Society for Magnetic Resonance in Medicine*, vol. 42, pp. 876-883, 1999.

[12] K. Scheffler, O. Heid and J. Hennig, "Magnetization preparation during the steady state: fat-saturated 3D True-FISP," *Magnetic resonance in medicine*, vol. 45, pp. 1075-1080, 2001.

[13] V. S. Deshpande, S. M. Shea, G. Laub, O. P. Simonetti, J. P. Finn and D. Li, "3D magnetization-prepared true-FISP: a new technique for imaging coronary arteries," *Magnetic resonance in medicine*, vol. 46, pp. 494-502, 2001.

[14] G. E. Gold, B. A. Hargreaves, S. B. Reeder, W. F. Block, R. Kijowski, S. S. Vasanawala, P. R. Kornaat, R. Bammer, R. Newbould, N. K. Bangerter and others, "Balanced SSFP imaging of the musculoskeletal system," *Journal of Magnetic Resonance Imaging: An Official Journal of the International Society for Magnetic Resonance in Medicine*, vol. 25, pp. 270-278, 2007.

[15] B. A. Hargreaves, S. S. Vasanawala, K. S. Nayak, B. S. Hu and D. G. Nishimura, "Fat-suppressed steady-state free precession imaging using phase detection," *Magnetic Resonance in Medicine: An Official Journal of the International Society for Magnetic Resonance in Medicine*, vol. 50, pp. 210-213, 2003.

[16] D. Liu, A. Steingoetter, J. Curcic and S. Kozerke, "Exploiting multicompartment effects in triple-echo steady-state T2 mapping for fat fraction quantification," *Magnetic resonance in medicine*, vol. 79, pp. 423-429, 2018.

[17] M. Cencini, L. Biagi, J. D. Kaggie, R. F. Schulte, M. Tosetti and G. Buonincontri, "Magnetic resonance fingerprinting with dictionary-based fat and water separation (DBFW MRF): A multi-component approach," *Magnetic resonance in medicine*, 2018.

[18] O. Bieri, "An analytical description of balanced steady-state free precession with finite radio-frequency excitation," *Magnetic resonance in medicine*, vol. 65, pp. 422-431, 2011.

The invention claimed is:

1. A method for determining by magnetic resonance imaging (MRI) one or several tissue types within a voxel in an object, the method comprising:
    performing a phase-cycled acquisition consisting of acquiring for the object a plurality of images with different radiofrequency phase increments and deriving a complex signal profile for each voxel of the images thus acquired;
    generating a multidimensional dictionary of simulated signal profiles, with each simulated signal profile being configured for simulating a previously derived complex signal profile;
    using a weight optimization algorithm configured for expressing the complex signal profile as a weighted sum of the simulated signal profiles, the weight optimization algorithm receiving as input the complex signal profile for each voxel and the simulated signal profiles of the dictionary, and outputting for each voxel a matrix M of optimized weights;
    for each voxel and each dimension of the matrix M, extracting from the matrix M a distribution of the optimized weights; and
    determining from the distributions thus obtained the one or several tissue types composing each voxel.

2. The method according to claim 1, which comprises computing, from the distributions, the fraction of a given tissue type within a voxel.

3. The method according to claim 1, wherein each dimension of the multidimensional dictionary is associated with a variable parameter whose values vary within a predefined range of values.

4. The method according to claim 3, wherein, for each dimension of the matrix M, computing the distribution by projecting the matrix M of optimized weights onto an axis representing values of the variable parameter associated to the respective dimension.

5. The method according to claim 3, which comprises computing the fraction of a given tissue type within a voxel as a ratio between a sum of the weights inside a range of the variable parameters and a sum of the weights in an entire simulated range of the variable parameters.

6. The method according to claim 1, wherein the dictionary is a 2D dictionary having two dimensions being a relaxation time ratio T1/T2 and an off-resonance frequency.

7. The method according to claim 1, which comprises optimizing weights in order to minimize a distance between a complex signal and a weighted sum of the simulated signals.

8. The method according to claim 1, which comprises computing a fat fraction and a water fraction for each voxel.

9. The method according to claim 1, which comprises creating a parametric map of the computed tissue fractions over an entire volume of the object.

10. The method according to claim 1, wherein the plurality of images acquired are steady-state gradient echo (GRE) images.

11. The method according to claim 1, which comprises estimating an object tissue property from the distribution extracted from the matrix M.

12. The method according to claim 1, which comprises using TR, TE, and RF excitation angle matching MRI imaging parameters used for the phase-cycled acquisition for generating the multidimensional dictionary of simulated signal profiles.

13. A system for determining a tissue type fraction for an object imaged by way of magnetic resonance imaging (MRI), the system comprising:
- a control unit having a processor to be connected to an imaging system and configured for determining a complex signal profile for each voxel of images of the object;
- the images of the object having been obtained with an MRI apparatus by performing a phase-cycled acquisition wherein several images of the object are acquired with different radiofrequency phase increments; and
- said control unit being configured for automatically carrying out the method according to claim 1.

* * * * *